(12) United States Patent
Taya

(10) Patent No.: US 7,777,294 B2
(45) Date of Patent: Aug. 17, 2010

(54) SEMICONDUCTOR DEVICE INCLUDING A HIGH-BREAKDOWN VOLTAGE MOS TRANSISTOR

(75) Inventor: Masatoshi Taya, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 517 days.

(21) Appl. No.: 11/245,137

(22) Filed: Oct. 7, 2005

(65) Prior Publication Data

US 2006/0027880 A1 Feb. 9, 2006

Related U.S. Application Data

(62) Division of application No. 10/611,857, filed on Jul. 3, 2003, now Pat. No. 7,002,210.

(30) Foreign Application Priority Data

Feb. 7, 2003 (JP) ............................. 2003-031185

(51) Int. Cl.
| | |
|---|---|
| H01L 29/00 | (2006.01) |
| H01L 23/58 | (2006.01) |
| H01L 31/00 | (2006.01) |
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 27/108 | (2006.01) |
| H01L 29/207 | (2006.01) |
| H01L 33/00 | (2006.01) |

(52) U.S. Cl. .................. 257/506; 257/93; 257/305; 257/339; 257/374; 257/395; 257/396; 257/397; 257/398; 257/399; 257/400; 257/409; 257/446; 257/500; 257/501; 257/502; 257/509; 257/510; 257/524; 257/551; 257/638; 257/917; 257/E29.02

(58) Field of Classification Search ............. 257/93, 257/305, 339, 374, 395–400, 409, 446, 500–502, 257/506, 509, 524, 551, 638, 917, 510, E29.02
See application file for complete search history.

(56) References Cited

U.S. PATENT DOCUMENTS 4,032,962 A 6/1977 Balyoz et al.

(Continued)

FOREIGN PATENT DOCUMENTS

EP 0042643 A1 12/1981

(Continued)

OTHER PUBLICATIONS

Japanese Office Action, with English translation, issued in Japanese Patent Application No. JP 2003-031185, mailed Mar. 31, 2009.

*Primary Examiner*—Ida M Soward
(74) *Attorney, Agent, or Firm*—McDermott Will & Emery LLP

(57) ABSTRACT

On a semiconductor substrate, a well is formed. In the well, one MOS transistor including a gate electrode, a source region, a source field limiting layer and a source/drain region, and another MOS transistor including a gate electrode, a drain electrode, a drain field limiting layer and a source/drain region are formed. The one and another MOS transistors are connected in series through the source/drain region common to the two transistors. Accordingly, a semiconductor device can be provided in which increase in pattern layout area is suppressed when elements including a high-breakdown voltage MOS transistor are to be connected in series.

2 Claims, 14 Drawing Sheets

U.S. PATENT DOCUMENTS

| | | | |
|---|---|---|---|
| 4,057,844 A | | 11/1977 | Smedley |
| 4,144,493 A | | 3/1979 | Lee et al. |
| 4,317,273 A | | 3/1982 | Guterman |
| 4,374,454 A | | 2/1983 | Jochems |
| 4,698,900 A | | 10/1987 | Esquivel |
| 5,015,601 A | * | 5/1991 | Yoshikawa ................. 438/262 |
| 5,218,224 A | | 6/1993 | Taguchi |
| 5,354,703 A | | 10/1994 | Gill |
| 5,469,383 A | | 11/1995 | McElroy et al. |
| 5,521,105 A | | 5/1996 | Hsu et al. |
| 5,545,907 A | | 8/1996 | Maari |
| 5,646,054 A | | 7/1997 | Rhee |
| 5,654,560 A | * | 8/1997 | Nishizawa et al. .......... 257/139 |
| 5,663,080 A | | 9/1997 | Cereda et al. |
| 5,753,954 A | | 5/1998 | Chi et al. |
| 5,808,342 A | | 9/1998 | Chen et al. |
| 5,950,088 A | | 9/1999 | Park |
| 6,303,961 B1 | | 10/2001 | Shibib |
| 6,365,945 B1 | | 4/2002 | Templeton et al. |
| 6,376,296 B2 | * | 4/2002 | Tung .......................... 438/221 |
| 6,462,378 B1 | * | 10/2002 | Kim ........................... 257/342 |
| 6,475,870 B1 | * | 11/2002 | Huang et al. ................. 438/316 |
| 6,617,217 B2 | | 9/2003 | Nandakumar et al. |
| 6,657,262 B2 | | 12/2003 | Patti |
| 6,777,297 B2 | | 8/2004 | Juengling |
| 6,833,586 B2 | * | 12/2004 | Tsuchiko .................... 257/343 |
| 2001/0009288 A1 | | 7/2001 | Kojima et al. |
| 2002/0060341 A1 | | 5/2002 | Terashima |
| 2002/0140019 A1 | | 10/2002 | Nakahata et al. |
| 2003/0025163 A1 | * | 2/2003 | Kwon ......................... 257/360 |
| 2003/0071314 A1 | | 4/2003 | Jang et al. |
| 2004/0115893 A1 | | 6/2004 | Ookubo et al. |

FOREIGN PATENT DOCUMENTS

| | | | |
|---|---|---|---|
| JP | 53-1478 | | 1/1978 |
| JP | 57-031180 | | 2/1982 |
| JP | 64-028963 | | 1/1989 |
| JP | 02-264477 | | 10/1990 |
| JP | 04-048655 | | 2/1992 |
| JP | 5-198802 | | 8/1993 |
| JP | 05-326949 | | 12/1993 |
| JP | 08-070055 | | 3/1996 |
| JP | 10-027903 | | 1/1998 |
| JP | 2001-94103 | | 4/2001 |
| JP | 2002-134744 | | 5/2002 |
| JP | 2002-158290 | | 5/2002 |
| JP | 2002134744 A | * | 5/2002 |

* cited by examiner

SEMICONDUCTOR DEVICE INCLUDING A HIGH-BREAKDOWN VOLTAGE MOS TRANSISTOR

RELATED APPLICATIONS

This application is a divisional of application Ser. No. 10/611,857, filed Jul. 3, 2003, now U.S. Pat. No. 7,002,210 which claims priority of Japanese Application No. 2003-031185, filed Feb. 7, 2003, the contents of which are hereby incorporated by reference.

BACKGROUND OF THE INVENTION

1. Field of the Invention

The present invention relates to a semiconductor device and, more specifically, to a semiconductor device including a high-breakdown voltage MOS transistor.

2. Description of the Background Art

Semiconductor devices having a high-breakdown voltage MOS (Metal Oxide Semiconductor) transistor applied to a logic circuit or an analog circuit, have been known. As an example of such a semiconductor device, a semiconductor device disclosed in Japanese Patent Laying-Open No. 2001-94103 will be described.

In the semiconductor device described in this laid-open application, in one of prescribed regions on a semiconductor substrate, an n-channel type high-breakdown voltage MOS transistor is formed.

First, in a P-type semiconductor device, a P-type well is formed. The P-type well is a well diffusion layer for the high-breakdown voltage MOS transistor. On the P-type well, a gate electrode is formed with a gate oxide film interposed.

Between the gate electrode and the gate diffusion layer and between the gate electrode and the source diffusion layer, an LOCOS (Local Oxidation of Silicon) oxide film is formed. The LOCOS oxide film separates the gate electrode from the drain diffusion layer at the surface, and separates the gate electrode from the source diffusion layer at the surface.

Immediately below the LOCOS oxide films at opposing ends of the gate electrode, a drain side offset region and a source side offset region are formed, respectively. Below the drain diffusion layer, the drain side well offset region is formed. Below the source diffusion layer, the source side well offset region is formed.

The gate, drain and source are electrically isolated from a channel stopper region serving as a diffusion layer to take a potential of the P-type well diffusion layer, by an N-type isolating diffusion layer, a P-type isolating diffusion layer and the LOCOS oxide film. The channel stopper is formed to surround the high-breakdown voltage MOS transistor.

The conventional semiconductor device including a high-breakdown voltage MOS transistor is formed in the above described manner.

The conventional semiconductor device described above, however, has the following problems. When the high-breakdown voltage MOS transistor is to be applied to a logic circuit such as an NAND circuit or an NOR circuit, or when it is to be applied to an analog circuit, it is necessary to connect the high-breakdown voltage MOS transistors in series.

When the above described high-breakdown voltage MOS transistors are to be connected in series, the source/drain of a high-breakdown voltage MOS transistor formed in one channel stopper must be connected, for example, by an aluminum interconnection, to the source/drain of a high-breakdown voltage MOS transistor formed in a different channel stopper.

At this time, the high-breakdown voltage MOS transistors are connected in series by repeatedly arranging the region (pattern) in which the high-breakdown voltage MOS transistor including the channel stopper is formed.

As the pattern is arranged repeatedly, the area occupied by the pattern on the semiconductor substrate becomes large, and the pattern layout area of the semiconductor device as a whole becomes undesirably large.

In a circuit in which a resistance element is connected to a high-breakdown voltage MOS transistor, the resistance element that is connected to the high-breakdown voltage MOS transistor must also have high breakdown voltage.

In order to ensure a high breakdown voltage, as a resistance element, a resistance element formed of polysilicon film is sometimes formed on the LOCOS oxide film. The resistance element formed in this manner is connected to the source/drain of the high-breakdown voltage MOS transistor through an aluminum interconnection.

When the resistance element is connected in series to the high-breakdown voltage MOS transistor, again, the region to form the resistance element of polysilicon film on the LOCOS film must be ensured. Accordingly, the pattern layout area of the semiconductor device as a whole becomes undesirably large.

SUMMARY OF THE INVENTION

The present invention was made to solve the above described problems and its object is to provide a semiconductor device in which increase in pattern layout area is suppressed in implementing series connection of elements including a high-breakdown voltage MOS transistor, such as a serial connection of high-breakdown voltage MOS transistors with each other, or a serial connection between a high-breakdown voltage MOS transistor and a resistance element.

According to an aspect, the present invention provides a semiconductor device including a first impurity region of a first conductivity type, a first isolating insulation film, a second impurity region of a second conductivity type, a third impurity region of the second conductivity type, a fourth impurity region of the second conductivity type, a first electrode portion and a second electrode portion. The first impurity region of the first conductivity type is formed on a main surface of a semiconductor substrate. The first isolating insulation film is formed on a surface of the first impurity region. The second impurity region of the second conductivity type is formed at that portion of the first impurity region which is positioned immediately below the first isolating insulation film. The third impurity region of the second conductivity type is formed on the surface of a portion of the first impurity region, spaced apart from the first isolating insulation film. The fourth impurity region of the second conductivity type is formed at a surface of a portion of the first impurity region on the side opposite to the third impurity region with the first isolating insulation film positioned therebetween, spaced apart from the first isolating insulation film. The first electrode portion is formed on that portion of the first impurity region which is sandwiched between the second impurity region and the third impurity region. The second electrode portion is formed at that portion of the first impurity region which is sandwiched between the second impurity region and the fourth impurity region.

By this structure, first, one MOS transistor including the second impurity region, the third impurity region and the first electrode portion is formed, and another MOS transistor including the second impurity region, the fourth impurity region and the second electrode portion is formed. The one and another MOS transistors are connected in series through the second impurity region common to both MOS transistors. Thus, as compared with a serial connection of individual MOS transistors, the area occupied by the MOS transistors can be reduced, and the increase in the pattern layout area of the semiconductor device can be suppressed.

According to another aspect, the present invention provides a semiconductor device including a first impurity region of a first conductivity type, an isolating insulation film, a second impurity region of a second conductivity type, a third impurity region of the second conductivity type, a fourth impurity region of the second conductivity type and an electrode portion. The first impurity region of the first conductivity type is formed on a main surface of a semiconductor substrate. The isolating insulation film is formed on a surface of the first impurity region. The second impurity region of the second conductivity type is formed at that portion of the first impurity region which is positioned immediately below the isolating insulation film. The third impurity region of the second conductivity type is electrically connected to the second impurity region, and formed at a portion of the first impurity region in a direction away from the isolating insulation film. The fourth impurity region of the second conductivity type is formed at a surface of that portion of the first impurity region which is opposite to the side of the third impurity region, spaced apart from the isolating insulation film. The electrode portion is formed on that portion of the first impurity region which is sandwiched between the second impurity region and the fourth impurity region. In the second impurity region, there is formed a portion having its width along a direction approximately orthogonal to the direction from the electrode portion to the third impurity region made narrower, from the side of the electrode portion to the side of the third impurity region.

By this structure, first, an MOS transistor including the second impurity region, the third impurity region, the fourth impurity region and the electrode portion is formed. The second impurity region of the MOS transistor also serves as a resistance element, and therefore, it follows that a resistance element is connected in series to the MOS transistor. Therefore, as compared with the case where the MOS transistor and a resistance element are connected, for example, by an aluminum interconnection, the area occupied by the MOS transistor and the resistance element can be reduced, and increase in pattern layout area in the semiconductor device can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
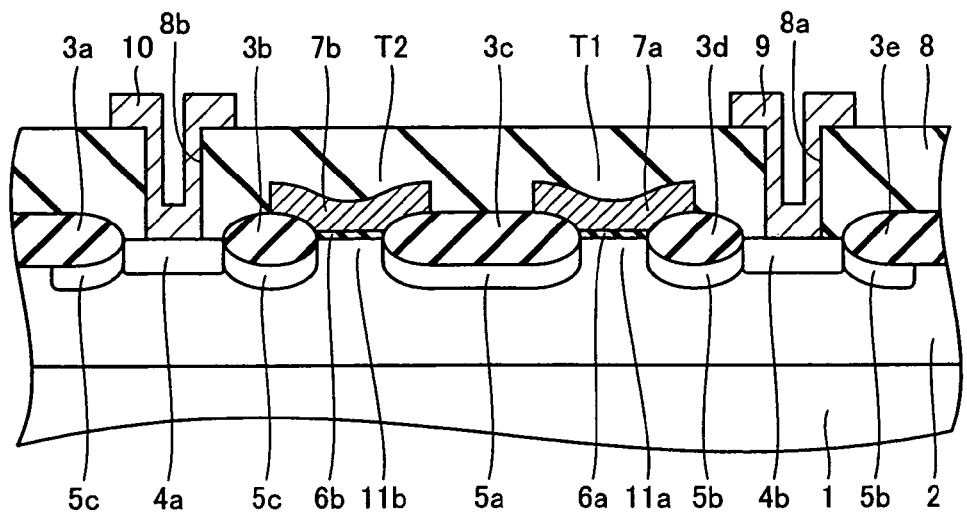
FIG. 1 is a cross sectional view of the semiconductor device in accordance with a first embodiment of the present invention taken along the line I-I of FIG. 2.

A semiconductor device including a high-breakdown voltage MOS transistor in accordance with a first embodiment will be described. As can be seen from FIGS. 1 and 2, on a semiconductor substrate 1, a well 2 as a first impurity region is formed. At prescribed regions of the surface of well 2, element isolating insulation films 3a to 3e are formed, respectively.

On the surface of well 2 sandwiched by element isolating insulation films 3a and 3b, a drain region 4a as a fourth impurity region is formed. In that region of well 2 which is immediately below element isolating insulation films 3a, 3b, a drain field limiting layer 5c as the fourth impurity region is formed to limit electric field of the drain.

On the surface of well 2 sandwiched by element isolating insulation films 3d and 3e, a source region 4 as a third impurity region is formed. In that region of well 2 which is immediately below element isolating insulation films 3d, 3e, a source field limiting layer 5b as the third impurity region is formed to limit electric field of the source.

In that region of well 2 which is immediately below element isolating insulation film 3c, a source/drain region 5a as a second impurity region is formed. On the surface of well 2 sandwiched by element isolating insulation films 3b, 3c, a gate electrode 7b as a second electrode portion is formed, with a gate insulating film 6b interposed.

On the surface of well 2 sandwiched by element isolating insulation films 3c and 3d, a gate electrode 7a as a first electrode portion is formed, with a gate insulating film 6a interposed.

A silicon oxide film 8 is formed on semiconductor substrate 1 to cover gate electrodes 7a, 7b. Contact holes 8b and 8a are formed, respectively exposing surfaces of drain region 4a and source region 4b, in the silicon oxide film.

On silicon oxide film 8, aluminum interconnections 9, 10, 12 and 13 are formed. Drain region 4a is electrically connected to aluminum interconnection 10 through a contact portion 10a. Source region 4b is electrically connected to aluminum interconnection 9 through a contact portion 9a.

Gate electrode 7a is electrically connected to aluminum interconnection 12 through a contact portion 12a. Gate electrode 7b is electrically connected to aluminum interconnection 13 through a contact portion 13a.

One MOS transistor T1 is formed including gate electrode 7a, source region 4b, source field limiting layer 5b and source/drain region 5a. Another MOS transistor T2 is formed including gate electrode 7b, drain region 4a, drain field limiting layer 5c and source/drain region 5a.

In the above described semiconductor device, source/drain region 5a formed in that region of well 2 which is immediately below element isolating insulation film 3c serves as a drain region for one MOS transistor, and serves as a source region for another MOS transistor. Through the source/drain region 5a, the one and another MOS transistors T1 and T2 are connected in series.

Figure 3:
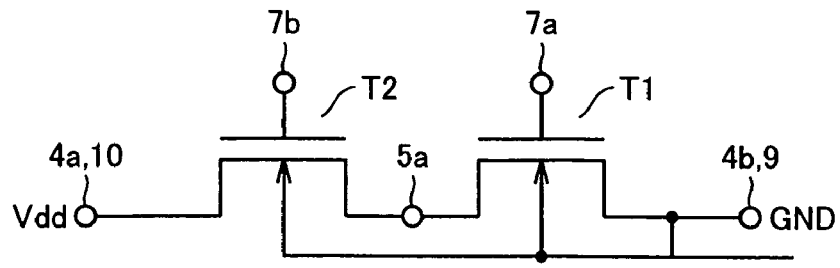
FIG. 3 represents an equivalent circuit of the semiconductor device in accordance with the same embodiment shown in FIGS. 1 and 2.
Figure 4:
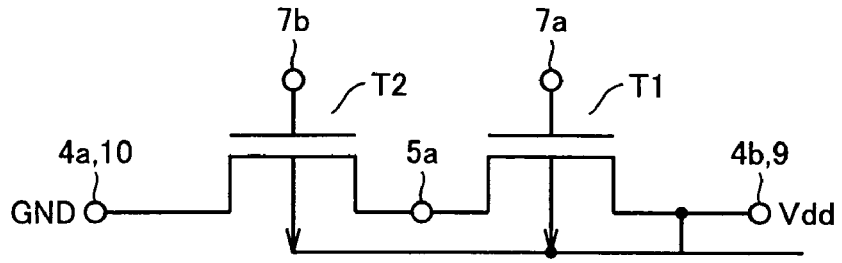
FIG. 4 represents another equivalent circuit of the semiconductor device in accordance with the same embodiment shown in FIGS. 1 and 2.

FIG. 3 shows an equivalent circuit in which MOS transistors T1 and T2 are n-channel MOS transistors, and FIG. 4 shows an equivalent circuit in which MOS transistors T1 and T2 are p-channel MOS transistors.

As described above, in the present semiconductor device, one MOS transistor T1 and another MOS transistor T2 are connected in series through the source/drain region 5a common to the one and another MOS transistors T1 and T2.

Thus, compared with a semiconductor device in which individual MOS transistors are connected in series, the area occupied by MOS transistors T1 and T2 can be reduced in the present semiconductor device, and therefore, increase in the pattern layout area of the semiconductor device can be suppressed.

Here, impurity concentrations of source field limiting layer 5b, drain field limiting layer 5c and source/drain region 5a are set to be lower than the impurity concentration of drain region 4a and source region 4b, and hence, a high junction breakdown voltage can be realized at the junction between these regions and well 2.

Second Embodiment

In the foregoing, a semiconductor device has been described in which drain field limiting layer 5c, source/drain region 5a and source field limiting layer 5b are formed at those portions of well region 2 which are positioned immediately below element isolating insulation films 3a to 3e.

Here, an example will be described in which the drain field limiting layer, the source/drain region and the source field limiting layer are formed as wells.

Figure 5:
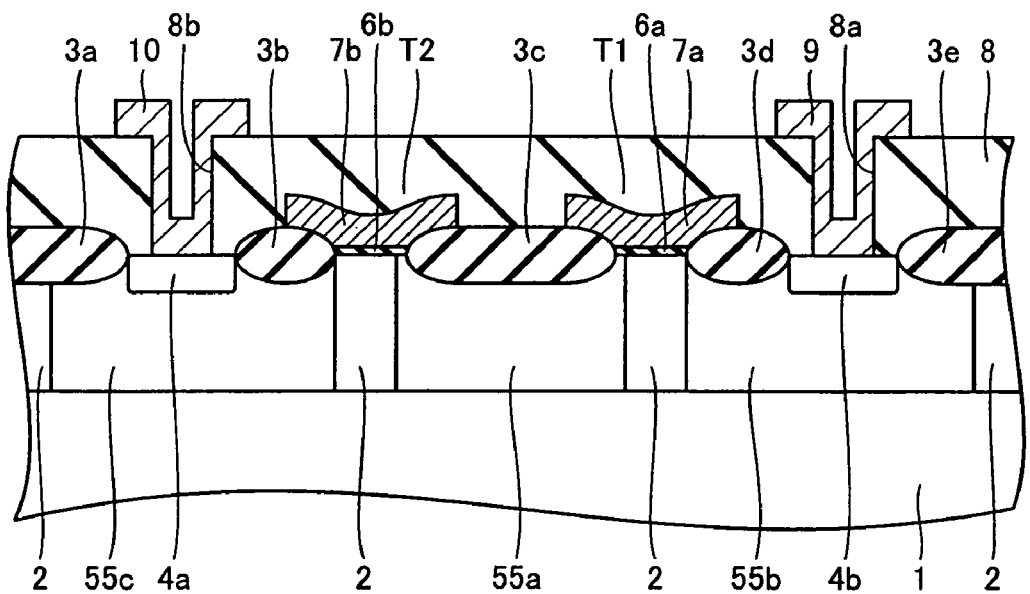
FIG. 5 is a cross sectional view of the semiconductor device in accordance with a second embodiment of the present invention taken along the line V-V of FIG. 6.
Figure 6:
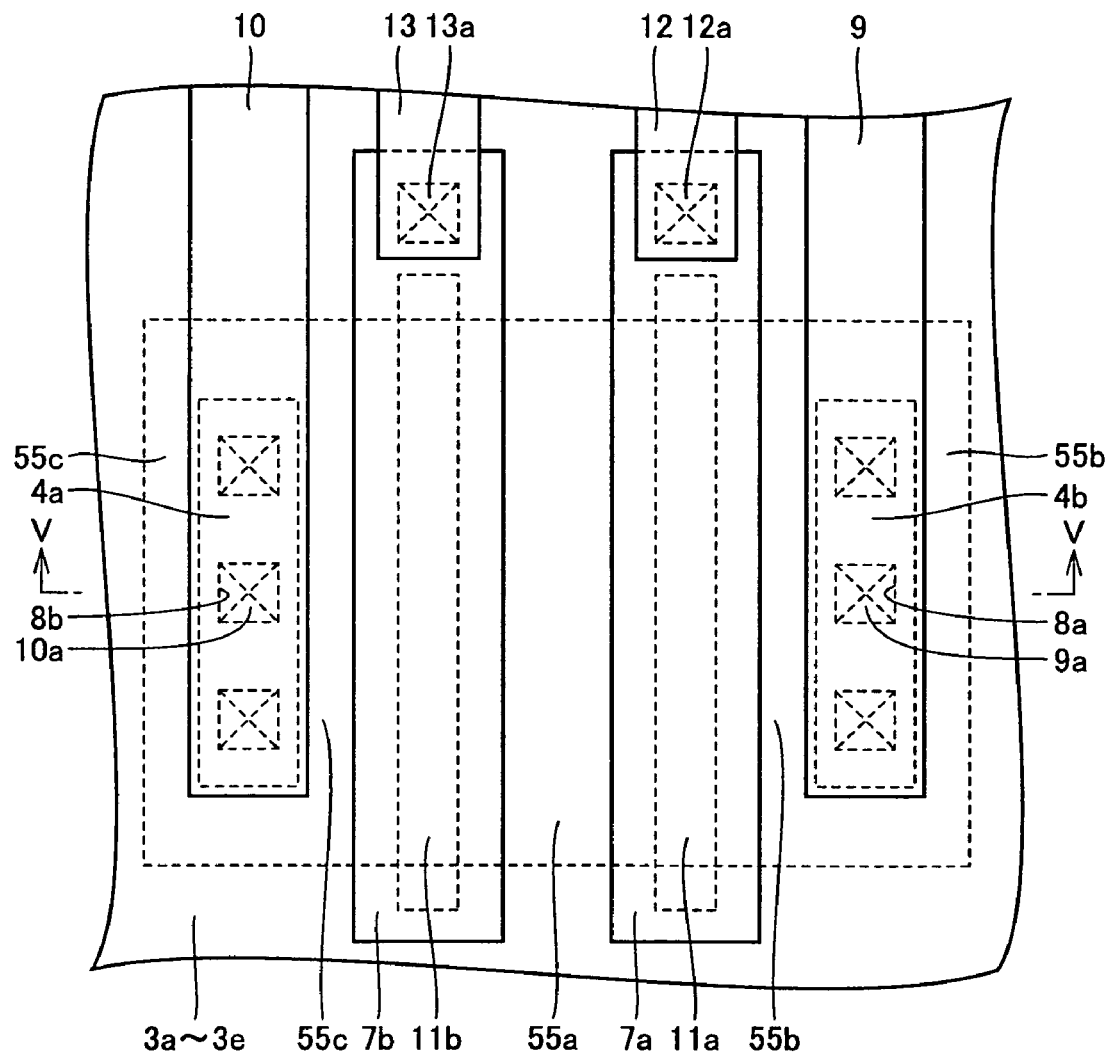
FIG. 6 is a plan view of the semiconductor device in accordance with the same embodiment shown in FIG. 5.

As shown in FIGS. 5 and 6, at regions immediately below element isolating insulation films 3a and 3b and drain region 4a, a well 55c reaching the surface of semiconductor substrate 1 is formed.

At a region immediately below element isolating insulation film 3c, a well 55a reaching the surface of semiconductor substrate 1 is formed. Further, at a region immediately below element isolating insulation films 3d, 3e and source region 4b, a well 55b reaching the surface of semiconductor substrate 1 is formed. Semiconductor substrate 1 is set to have a conductivity type opposite to that of wells 55a to 55c.

Figure 7:
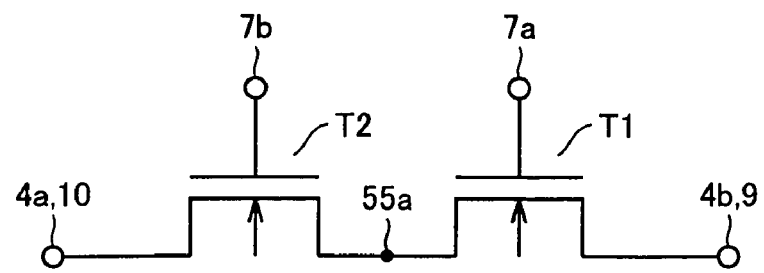
FIG. 7 represents an equivalent circuit of the semiconductor device in accordance with the same embodiment shown in FIGS. 5 and 6.

Therefore, in the equivalent circuit of the semiconductor device shown in FIG. 7, the one and another MOS transistors T1 and T2 connected in series have back gates set to the same potential as the potential of semiconductor substrate 1.

Further, impurity concentrations of wells 55a to 55c are set to be lower than the impurity concentrations of drain region 4a and source region 4b.

Figure 2:
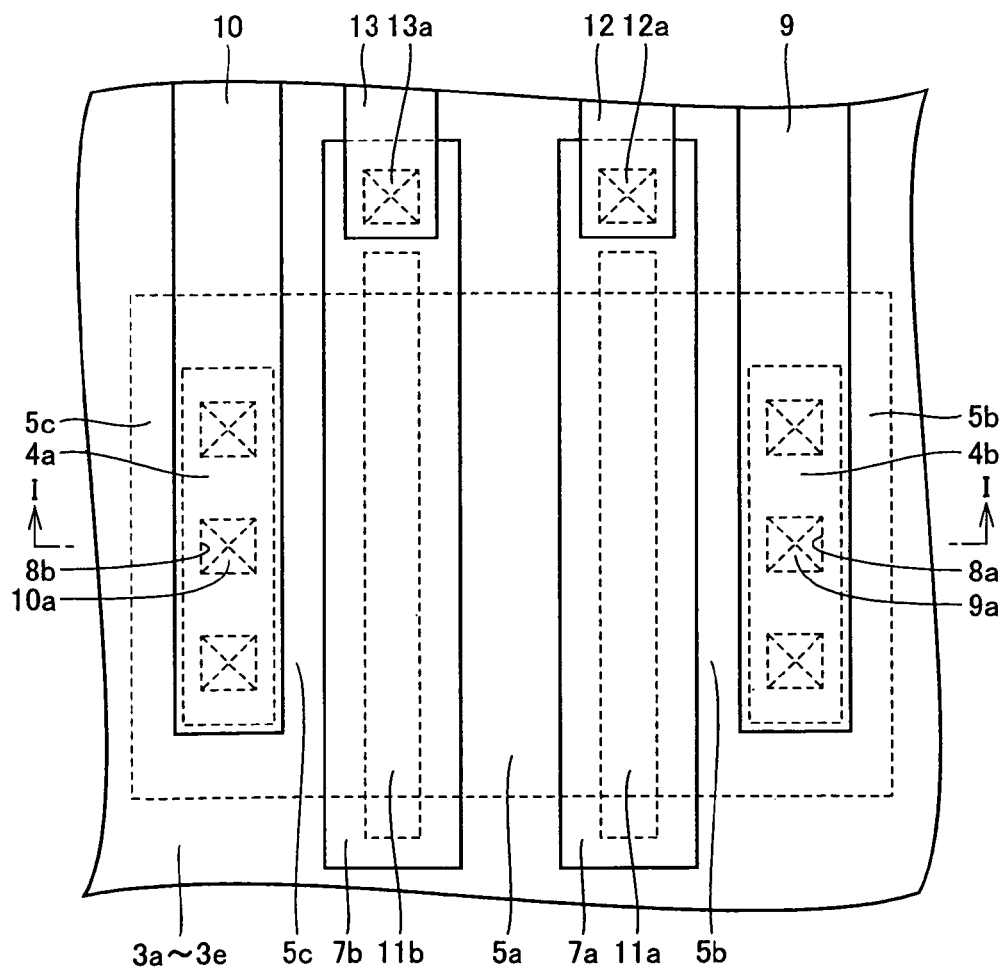
FIG. 2 is a plan view of the semiconductor device in accordance with the same embodiment shown in FIG. 1.

Except for these points, the semiconductor device is the same as that of FIG. 1, and therefore, corresponding portions are denoted by the same reference characters and description thereof will not be repeated.

By the above described semiconductor device, the following effect can be obtained in addition to the effects described with reference to the first embodiment.

When an n-channel MOS transistor is formed using a p-type semiconductor substrate as semiconductor substrate 1, by providing n-type wells 55a to 55c, it becomes unnecessary to form an n-type field limiting layer, and hence, process steps can be simplified.

Third Embodiment

Here, a semiconductor device will be described as an example, in which two MOS transistors having mutually different gate widths (channel widths) are connected in series.

Figure 8:
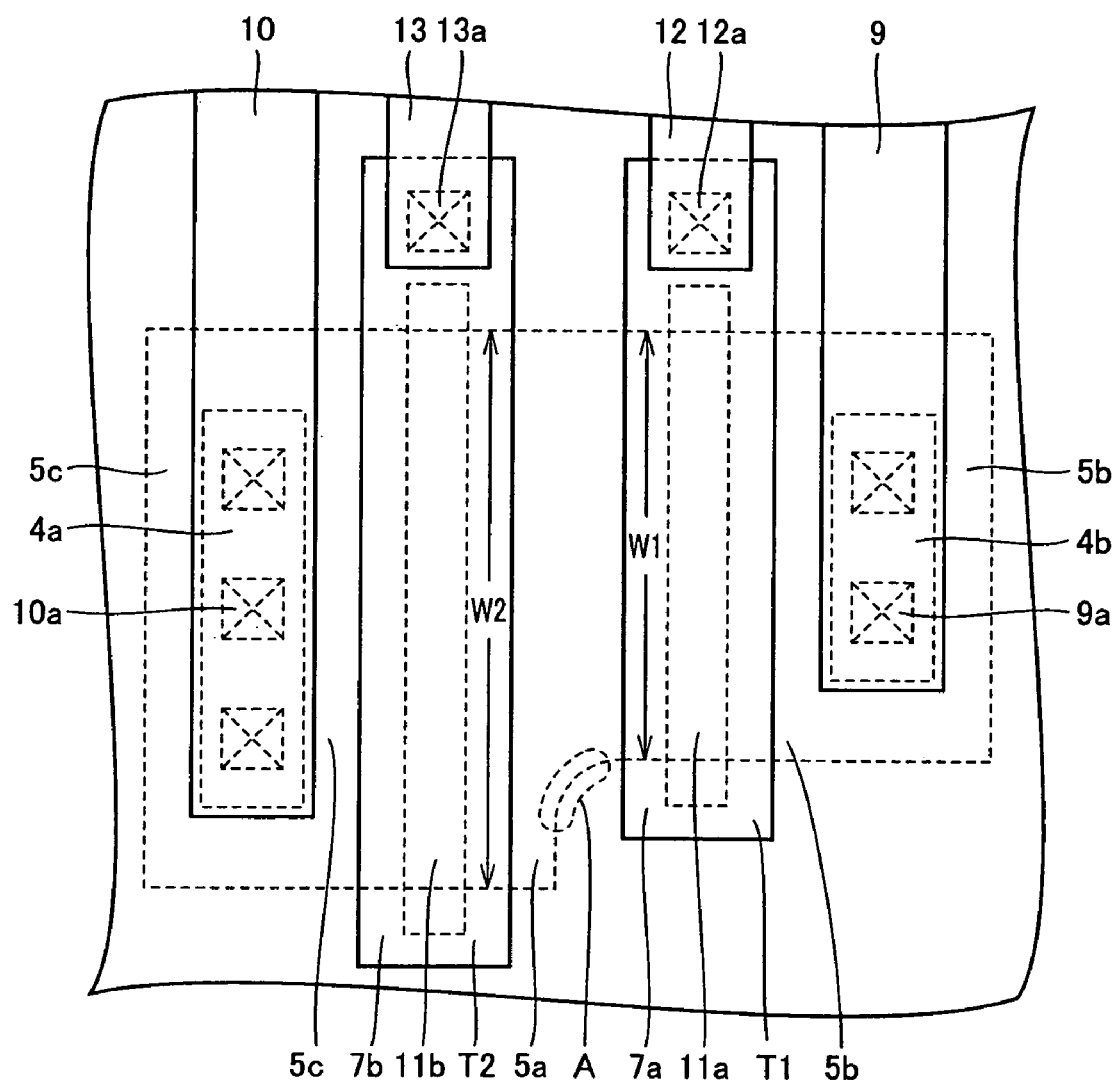
FIG. 8 is a plan view of the semiconductor device in accordance with a third embodiment.

Referring to FIG. 8, channel W1 of MOS transistor T1 is made shorter than channel W2 of MOS transistor T2. Source/drain region 5a has its width along the direction of extension of gate electrodes 7a and 7b changed smoothly at a portion from the side of channel region 11b to the side of channel region 11a, as denoted by the portion A surrounded by dotted lines.

Except for these points, the semiconductor device is the same as that of FIG. 1, and therefore, corresponding portions are denoted by the same reference characters and description thereof will not be repeated.

By the above described semiconductor device, the following effect can be obtained in addition to the effects described with reference to the first embodiment.

First, MOS transistors T1 and T2 have channel widths W1 and W2 different from each other. Therefore, in the source/drain region 5a, the width along the direction of extension of gate electrode 7b at a portion on the side of channel region 11b comes to be different from the width along the direction of extension of gate electrode 7a at a portion on the side of channel region 11a.

Figure 9:
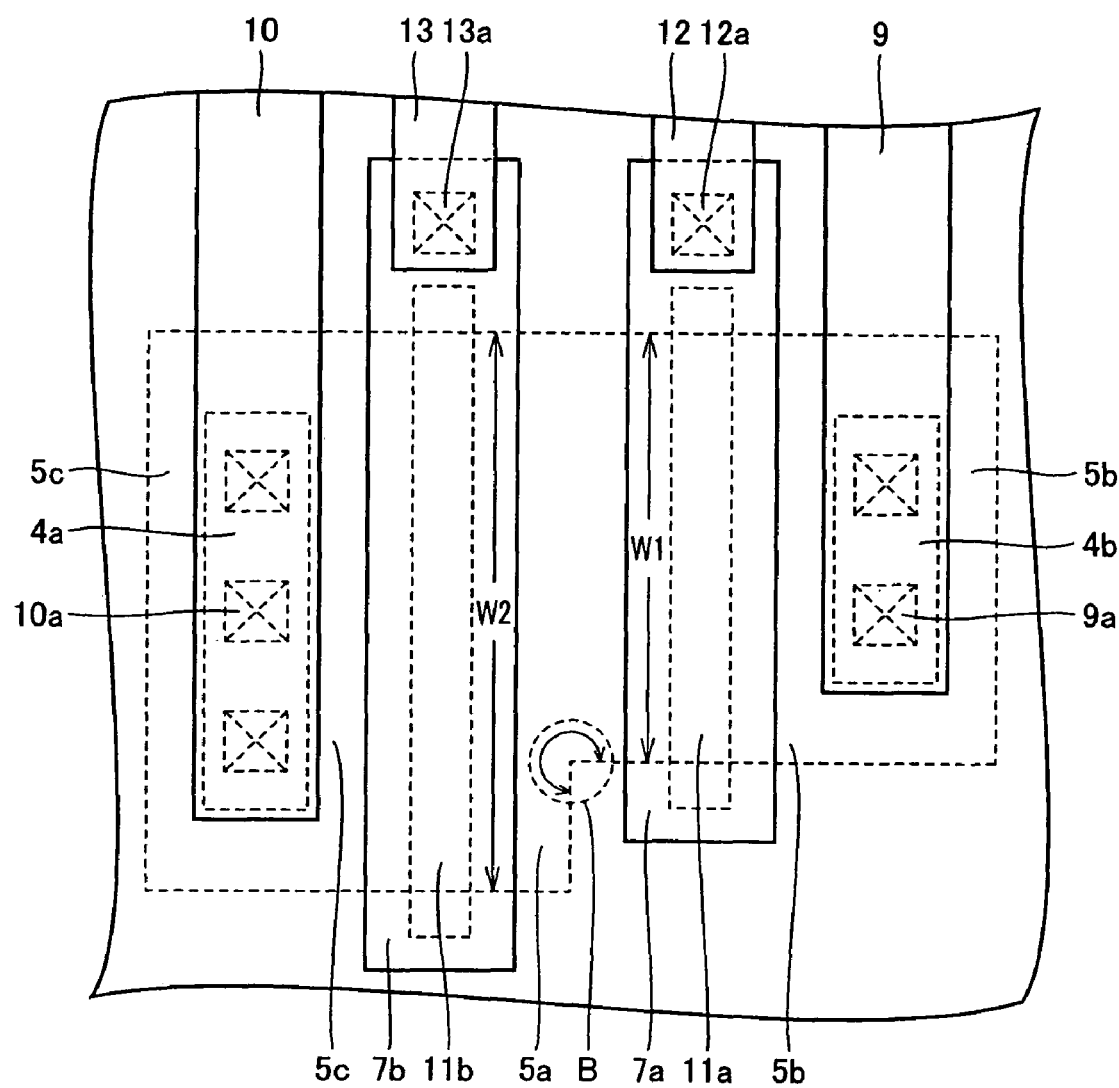
FIG. 9 is a plan view illustrating effects of the semiconductor device in accordance with the same embodiment shown in FIG. 8.

Here, in a semiconductor device in which the width of source/drain region 5a changes not smoothly but steeply at an angle of 270° as represented by the portion B surrounded by dotted lines in FIG. 9, junction breakdown voltage between source/drain region 5a and well 2 degrades significantly at this steeply changing portion.

By contrast, in the present semiconductor device, there is a portion that changes smoothly from the portion on the side of channel region 11b to the portion on the side of channel region 11a, in source/drain region 5a.

Accordingly, there is no portion between source/drain region 5a and well 2 to which electric field concentrates, and thus, junction breakdown voltage between source/drain region 5a and well 2 can be improved.

Fourth Embodiment

In the third embodiment, it is described that in a semiconductor device having two MOS transistors with mutually different gate widths (channel widths) connected in series, when there is a portion at which the width of the source/drain region changes steeply from a portion near one channel region to a portion near the other channel region, the junction breakdown voltage between the source/drain region and the well degrades significantly at that steep changing portion.

Here, a semiconductor device will be described in which the electric field is limited even when it has such a portion at which the width of the source/drain region changes steeply.

Figure 10:
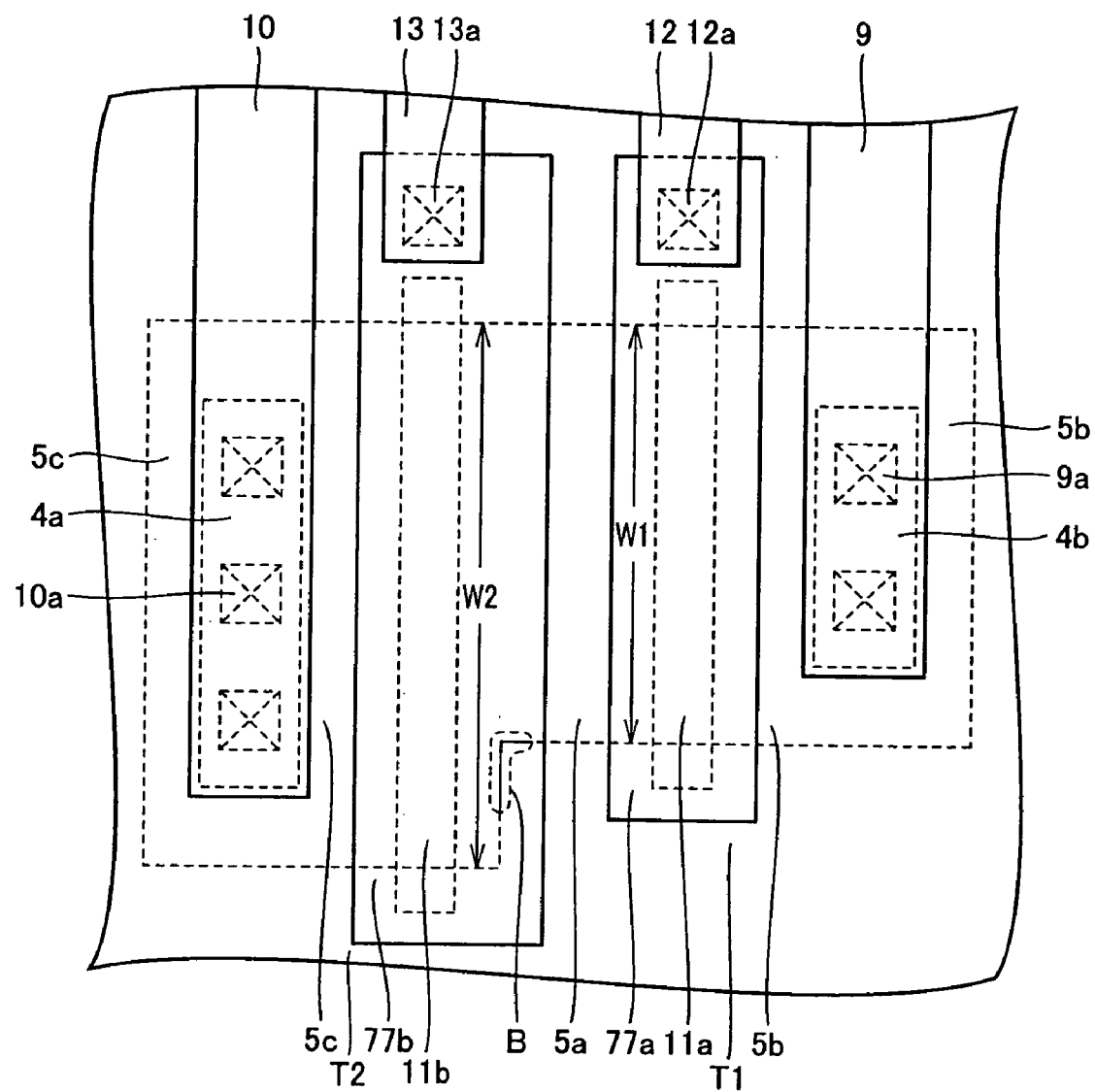
FIG. 10 is a plan view of a semiconductor device in accordance with a fourth embodiment of the present invention.

Referring to FIG. 10, channel width W1 of MOS transistor T1 is set shorter than channel width W2 of MOS transistor T2. In source/drain region 5a, there is a portion B surrounded by dotted lines, having its width changed steeply, from the side of channel region 11b to the side of channel region 11a.

Gate electrode 77b is formed to cover not only the channel region 11b but also the steeply changing portion. Except for these points, the semiconductor device is the same as that of FIG. 1, and therefore, corresponding portions are denoted by the same reference characters and description thereof will not be repeated.

By the above described semiconductor device, the following effect can be obtained in addition to the effects described with reference to the first embodiment.

Figure 11:
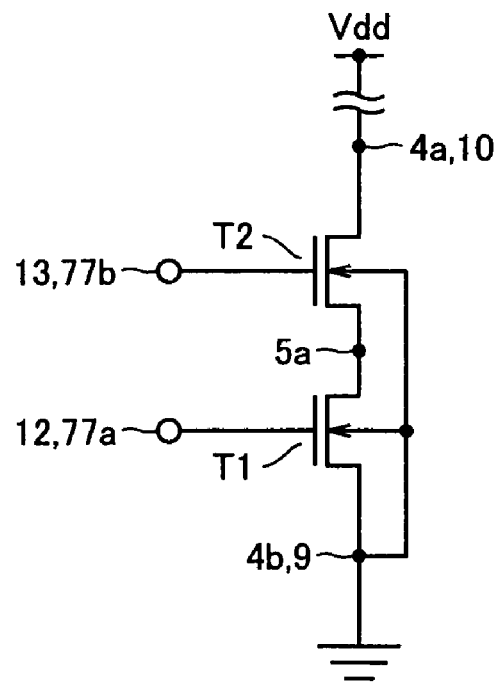
FIG. 11 represents an equivalent circuit of the semiconductor device in accordance with the same embodiment shown in FIG. 10.
Figure 12:
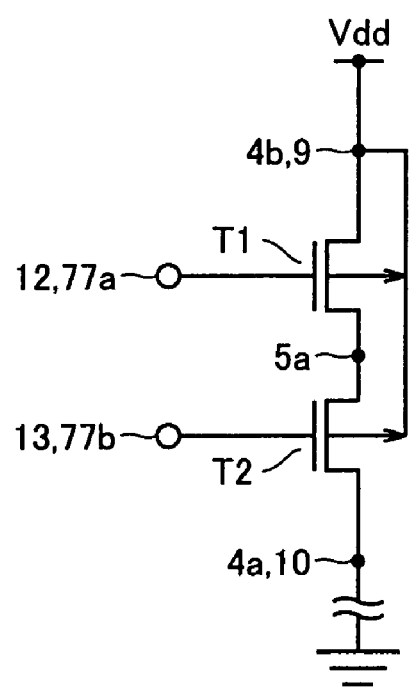
FIG. 12 represents another equivalent circuit of the semiconductor device in accordance with the same embodiment shown in FIG. 10.

FIG. 11 represents an equivalent circuit in which n-channel MOS transistors T1 and T2 are connected in series, and FIG. 12 represents an equivalent circuit in which p-channel MOS transistors T1 and T2 are connected in series.

Referring to FIGS. 11 and 12, the portion corresponding to the portion B surrounded by dotted lines is the source/drain region 5a common to the two MOS transistors T1 and T2.

In the example shown in FIG. 11, a reverse bias voltage is applied to source/drain region 5a only when MOS transistor T2 turns on with a reverse bias voltage being applied to drain region 4a (aluminum interconnection 10).

In n-channel MOS transistors T1 and T2, when the voltage at drain region 4a is Vdd, n-channel MOS transistor T2 turns on (voltage at gate 77b=Vdd).

Accordingly, the voltage at source/drain 5a will be the same as drain region 4a, that is, Vdd. At this time, well 2 providing a PN junction with source/drain region 5a will be at the same voltage as source region 4b (GND), and hence, it is in a reverse biased (Vdd) state.

Specifically, when a reverse bias voltage is applied to source/drain region 5a, the voltage at gate electrode 77b will be the same as the voltage at source/drain region 5a.

In the present semiconductor device, gate electrode 77b is formed to cover the steep portion at which junction breakdown voltage between source/drain region 5a and well 2 becomes small, as shown in FIG. 10.

When a reverse bias voltage is applied to source/drain region 5a, it follows that the same voltage as source/drain region 5a is applied to gate electrode 7b. As this voltage is applied to gate 77b, an electric field is generated toward well 2 of semiconductor substrate 1.

By this electric field, the depletion layer extending from the interface between source/drain region 5a and well 2 is further extended. The above described function is also attained in the example shown in FIG. 12.

Thus, even when there is formed a steep portion at source/drain region 5a, breakdown voltage in the MOS transistor can be ensured.

Fifth Embodiment

A semiconductor device in which an MOS transistor and a resistance element are connected in series will be described as a semiconductor device in accordance with the fifth embodiment of the present invention.

Figure 13:
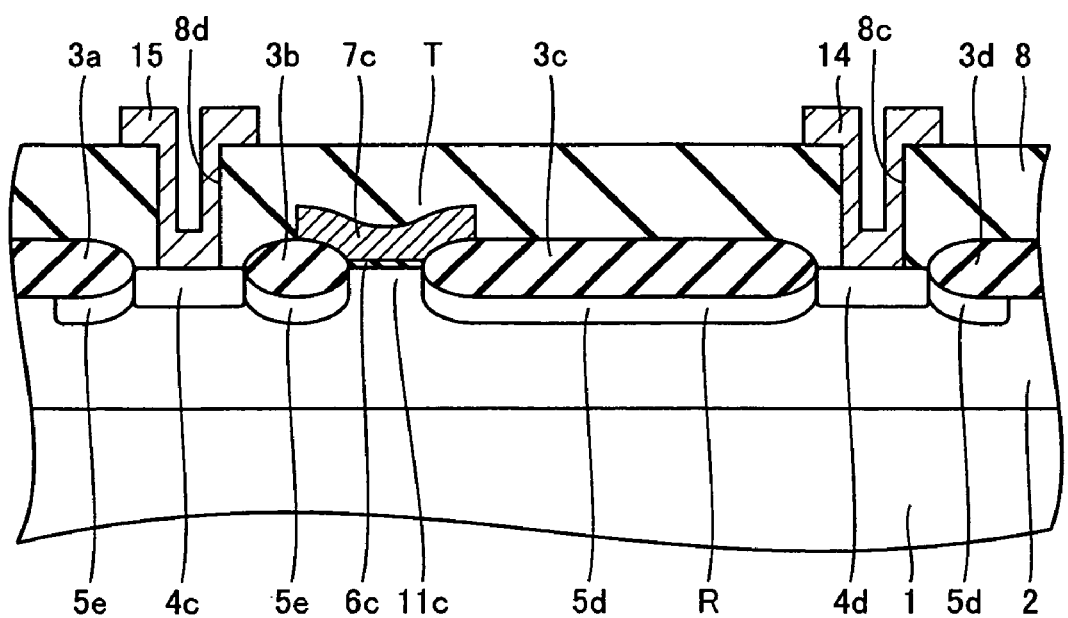
FIG. 13 is a cross sectional view of the semiconductor device in accordance with a fifth embodiment of the present invention taken along the line XIII-XIII of FIG. 14.
Figure 14:
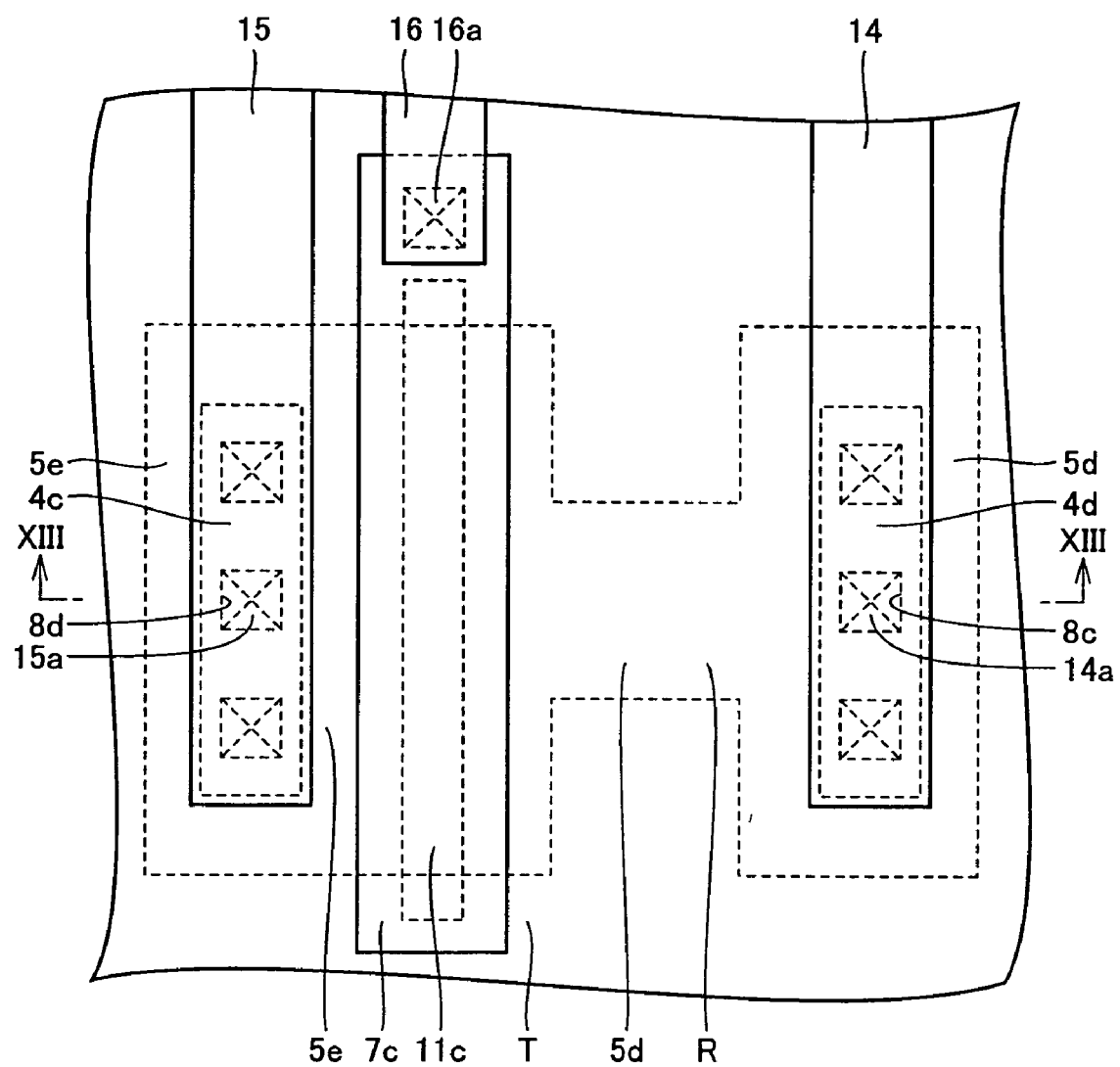
FIG. 14 is a plan view of the semiconductor device shown in FIG. 13.
Figure 15:
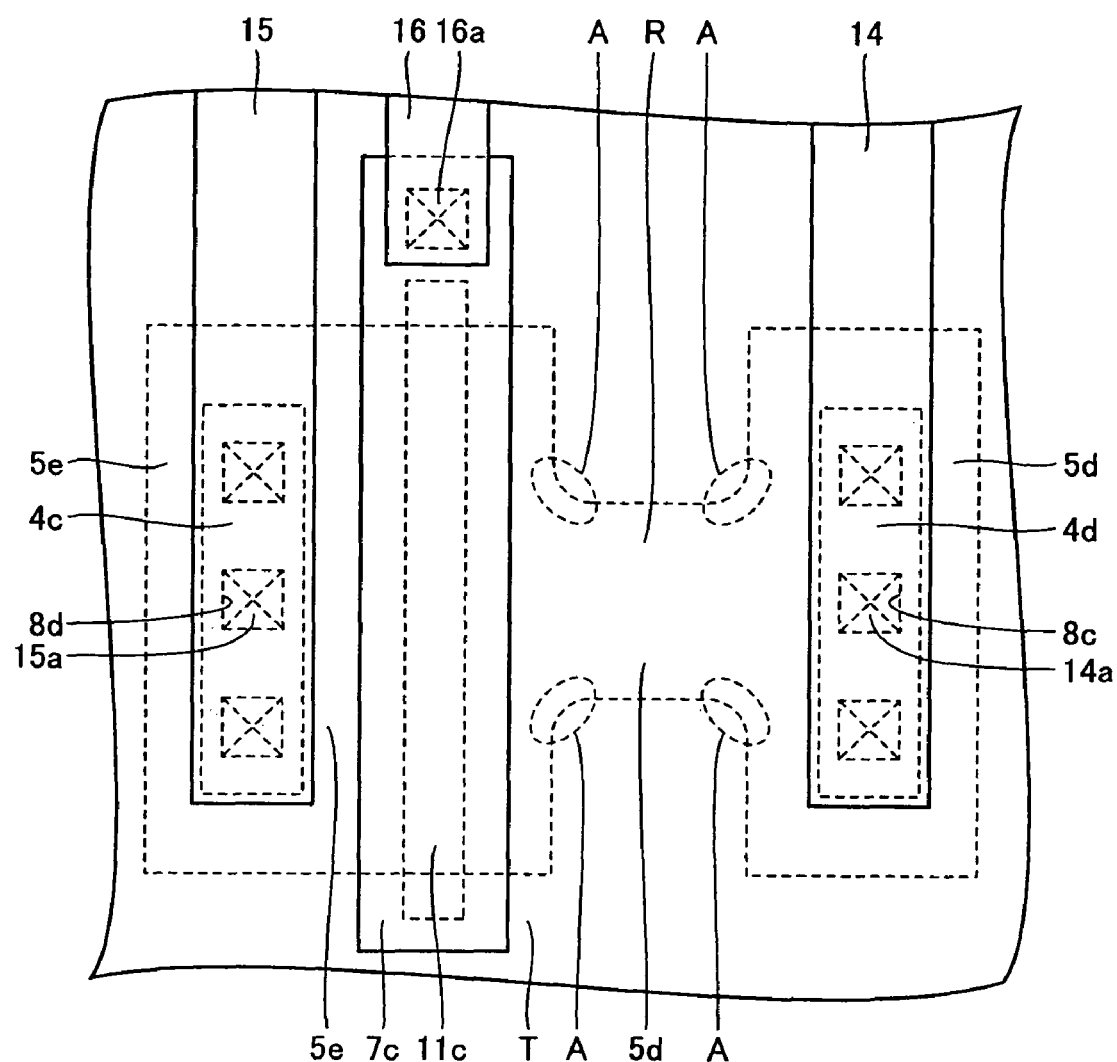
FIG. 15 is a plan view of the semiconductor device in accordance with a sixth embodiment of the present invention.

Referring to FIGS. 13 and 14, well 2 as a first impurity region is formed on semiconductor substrate 1. At prescribed regions on the surface of well 2, element isolating insulation films 3a to 3d are formed, respectively.

On the surface of well 2 sandwiched by element isolating insulation films 3a and 3b, a drain region 4c as a fourth impurity region is formed. In that region of well 2 which is immediately below element isolating insulation films 3a, 3b, a source/drain field limiting layer 5e as the fourth impurity region is formed to limit electric field of the source/drain.

On the surface of well 2 sandwiched by element isolating insulation films 3c and 3d, a source/drain region 4d as a third impurity region is formed. In that region of well 2 which is immediately below element isolating insulation films 3c, 3d, a source/drain field limiting layer 5d as the second impurity region is formed to limit electric field of the source/drain.

On the surface of well 2 sandwiched by element isolating insulation films 3b and 3c, a gate electrode 7c is formed, with a gate insulating film 6c interposed.

Silicon oxide film 8 is formed on semiconductor substrate 1 to cover gate electrode 7c. Contact holes 8d and 8c are formed, respectively exposing surfaces of source/drain regions 4c and 4d, in silicon oxide film 8.

On silicon oxide film 8, aluminum interconnections 15, 14 and 16 are formed. Source/drain region 4c is electrically connected to aluminum interconnection 15 through a contact portion 15a.

Source/drain region 4d is electrically connected to aluminum interconnection 14 through a contact portion 14a. Further, gate electrode 7c is electrically connected to aluminum interconnection 16 through a contact portion 16a.

An MOS transistor T is formed including gate electrode 7a, source/drain regions 4c, 4d and source/drain field limiting layers 5e, 5d.

Generally, when an MOS transistor is formed, source/drain regions 4c, 4d are formed close to the channel region, so as to attain higher performance of the transistor.

In the above described semiconductor device, one source/drain region 4d of the pair of source/drain regions 4c, 4d is formed spaced by a prescribed distance from channel region 11c. Here, the prescribed distance corresponds to the length along the current flow of source/drain field limiting layer 5d that has impurity concentration lower than that of source/drain regions 4c, 4d.

As the length of source/drain field limiting layer 5d having lower impurity concentration is made longer, source/drain field limiting layer 5d comes to have the function of a resistance element R.

Particularly, as the length (width) in the direction approximately orthogonal to the direction from channel region 11c to source/drain region 4d is made narrower in source/drain field limiting layer 5d, resistance value of resistance element R can be made higher.

As described above, in the present semiconductor device, source/drain field limiting layer 5d of one MOS transistor has a function of a resistance element, and it follows that MOS transistor T and resistance element R are connected in series.

Accordingly, when compared with a semiconductor device in which one MOS transistor and a resistance element are connected in series by an aluminum interconnection or a semiconductor device in which one of two transistors connected in series is always kept ON and the MOS transistor that is kept ON is used as an ON resistance, the area occupied by the MOS transistor T and the resistance element R can be reduced in the present semiconductor device, and increase in pattern layout area in the semiconductor device can be suppressed.

In the above described semiconductor device, one source/drain region 5d of a pair of source/drain field limiting layers 5d, 5e is used to provide resistance element R, as an example. Resistance elements may be provided by both of the source/drain regions 5d and 5e.

Sixth Embodiment

An example of a semiconductor device will be described, which further improves the junction breakdown voltage of the semiconductor device described with reference to the fifth embodiment.

As denoted by portions A surrounded by dotted lines, in the source/drain field limiting layer 5d having the function of resistance element R, there are portions changing smoothly, formed from narrow to wide portions.

Except for these points, the structure is the same as that of FIGS. 13 and 14, and therefore, corresponding portions are denoted by the same reference characters and description thereof will not be repeated.

By the above described semiconductor device, the following effect can be obtained in addition to the effects described with reference to the fifth embodiment.

As portions having their width changed smoothly are formed in source/drain field limiting layer 5d, a portion to which electric field concentrates is eliminated between source/drain field limiting layer 5d and well 2, as compared with the example in which the width changes steeply. As a result, the junction breakdown voltage between source/drain field limiting layer 5d and well 2 can be improved.

Seventh Embodiment

Another example of a semiconductor device that further improves junction breakdown voltage of the semiconductor device described with reference to the fifth embodiment will be described.

Figure 16:
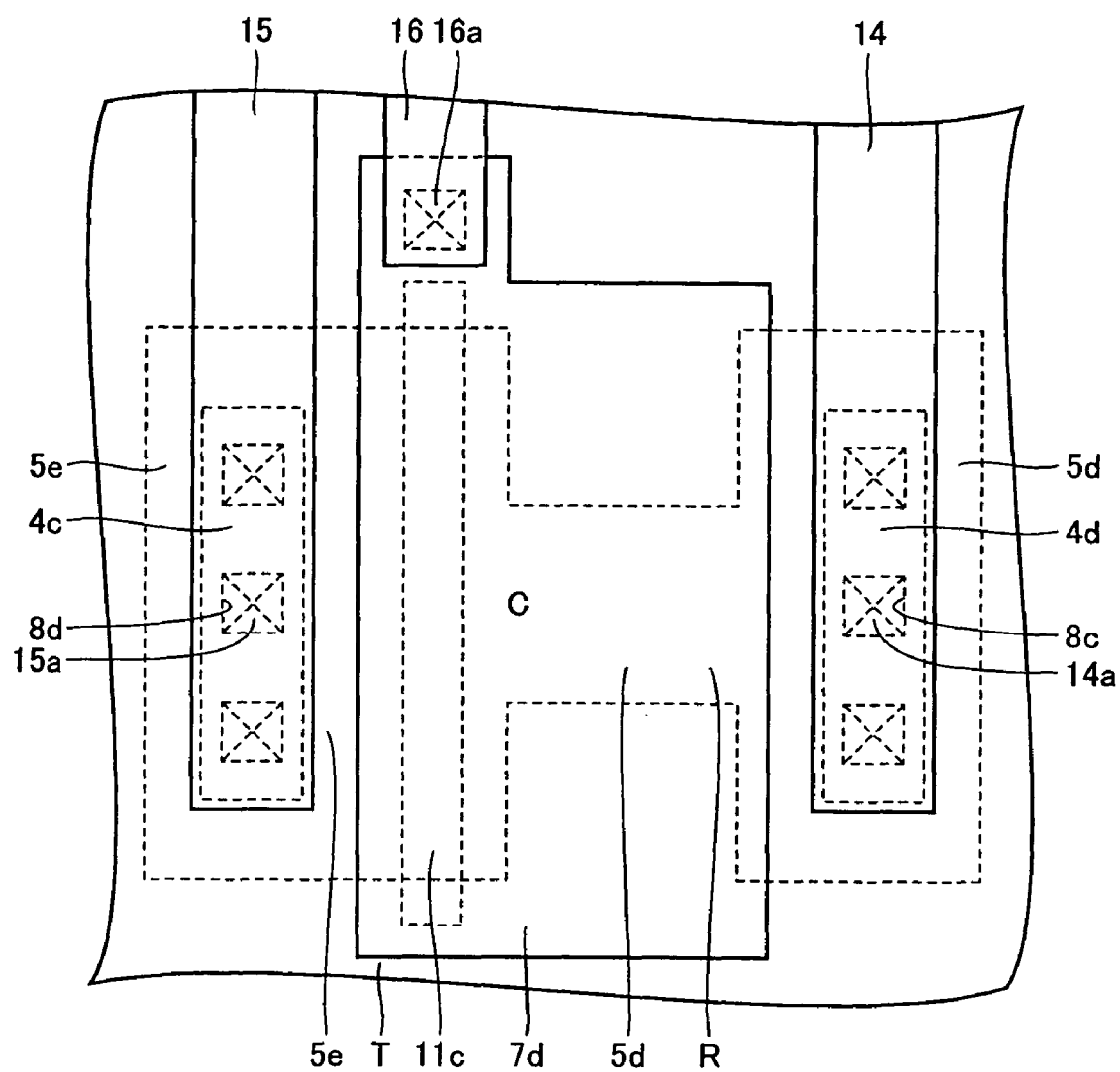
FIG. 16 is a plan view of the semiconductor device in accordance with a seventh embodiment of the present invention.

As shown in FIG. 16, source/drain field limiting layer 5d having the function of resistance element R has a portion of which width changes steeply, as in the case of the semiconductor device shown in FIG. 14.

Gate electrode 7d is formed to cover the steeply changing portion. Except for this point, the structure is the same as that of the semiconductor device shown in FIGS. 13 and 14. Therefore, corresponding portions are denoted by the same reference characters and description thereof will not be repeated.

By the above described semiconductor device, the following effect can be obtained in addition to the effects described with reference to the fifth embodiment.

Figure 17:
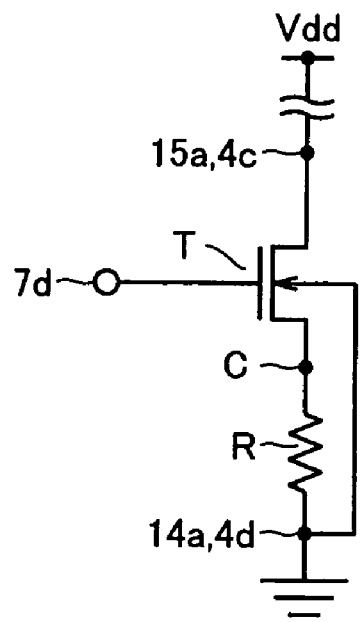
FIG. 17 represents an equivalent circuit of the semiconductor device in accordance with the same embodiment shown in FIG. 16.
Figure 18:
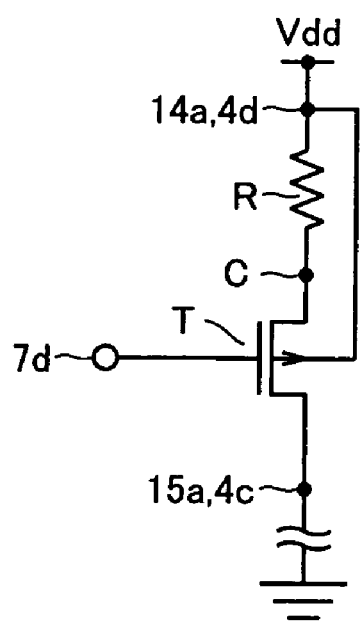
FIG. 18 represents another equivalent circuit of the semiconductor device in accordance with the same embodiment shown in FIG. 16.

FIG. 17 represents an equivalent circuit in which an n-channel MOS transistor T and a resistance element R are connected in series, and FIG. 18 represents an equivalent circuit in which a p-channel MOS transistor T and a resistance element R are connected in series.

Resistance element R in FIGS. 17 and 18 corresponds to source/drain field limiting layer 5d shown in FIG. 16. A high reverse bias voltage is applied to the portion (point C) of resistance element R on the side of the channel region only when the MOS transistor T turns on with a reverse bias voltage being applied to source/drain region 4c.

In the n-channel MOS transistor T shown in FIG. 17, assume that a voltage Vdd is applied to source/drain region 4c, and a voltage Vdd is applied to gate electrode 7d.

Here, the n-channel MOS transistor T turns on, and the voltage at point C of resistance element R attains approximately to Vdd.

Here, the voltage at well 2 that forms a PN junction with resistance element R is the GND voltage. Therefore, it follows that a reverse bias voltage is applied to point C of the resistance element R. Specifically, when a reverse bias voltage is applied to a portion on the side of the channel region of the resistance element R, the voltage applied to gate electrode 7d is also approximately the same as the reverse bias voltage.

In the present semiconductor device, gate electrode 7d is formed to cover that portion of resistance element R of which width is changed steeply.

When a reverse bias voltage is applied to the portion (point C) on the channel side of resistance element R, it follows that approximately the same voltage as the reverse bias voltage is applied to gate electrode 7d.

As this voltage is applied to gate electrode 7d, an electric field is generated toward well 2 of semiconductor substrate 1. By the electric field, the depletion layer extending from the interface between source/drain field limiting layer 5d serving as the resistance element R and well 2 is further extended.

Accordingly, even when there is a steep portion formed in source/drain region 5d serving as resistance element R, breakdown voltage of the resistance element R and MOS transistor can be ensured.

In the case of p-channel MOS transistor T shown in FIG. 18, a reverse bias voltage is applied to the portion (point C) on the side of the channel region of the resistance element when p-channel MOS transistor T turns on with a reverse bias voltage such as the GND voltage being applied to source/drain region 4c.

In this state, as in the case of the n-channel MOS transistor, the voltage same as the reverse bias voltage is applied to gate electrode 7d. Thus, the depletion layer is made wider, and breakdown voltage in the resistance element R and the MOS transistor can be ensured.

In the source/drain field limiting layer 5d, impurity concentration is made as low as possible, in order to improve junction breakdown voltage with well 2. It is noted that when a high reverse bias voltage is applied to the narrow portion of resistance element R having the low impurity concentration, that portion of resistance element R may possibly be depleted.

In the present semiconductor device, by the electric field generated by the voltage applied to gate electrode 7d, depletion of source/drain field limiting layer 5d (resistance element R) is suppressed. Thus, electric field dependency of resistance element R is reduced, and a stable resistance value can be ensured.

Eight Embodiment

Another example of a semiconductor device that further improves junction breakdown voltage of the semiconductor device described with reference to the fifth embodiment will be described.

Figure 19:
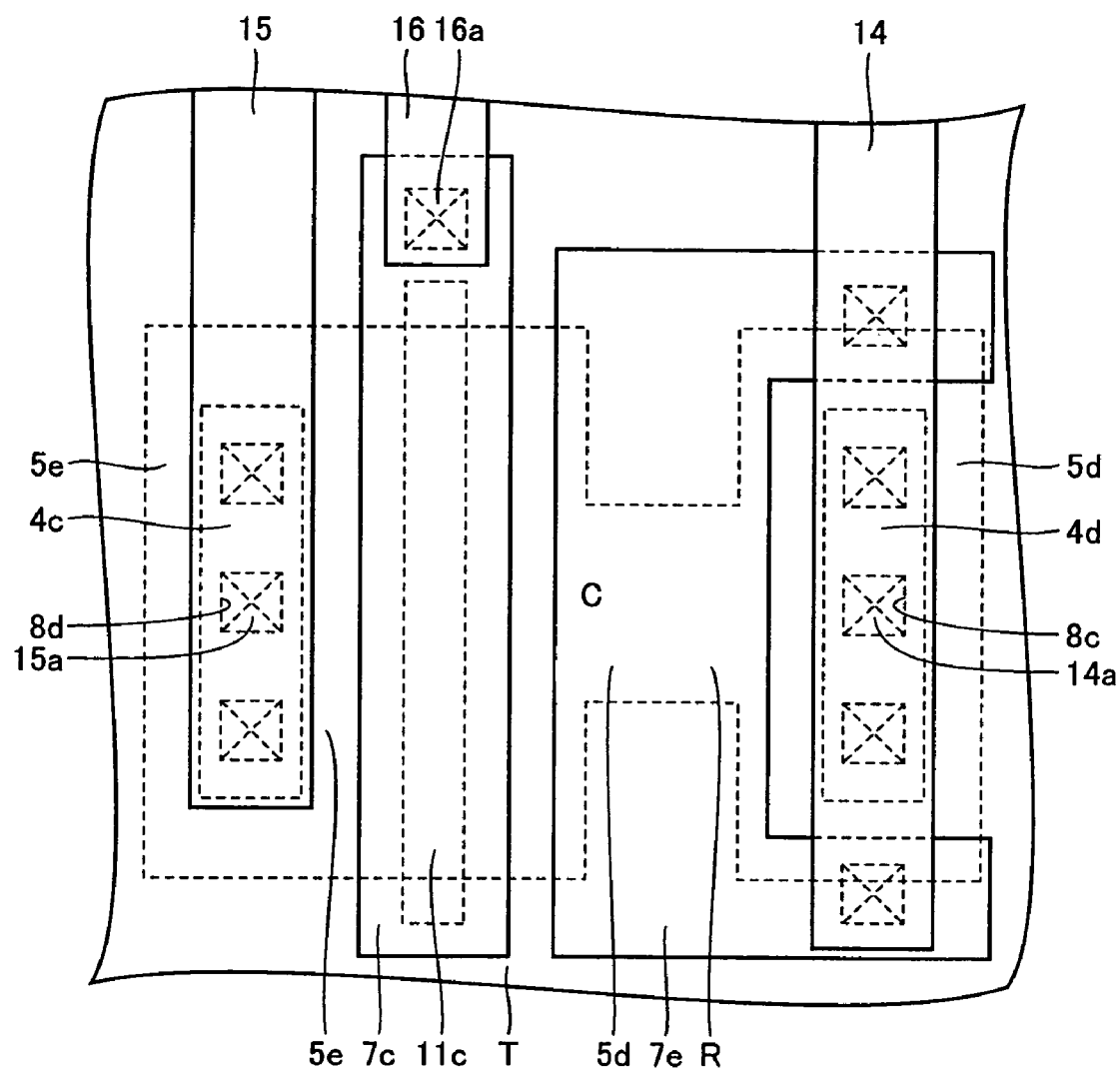
FIG. 19 is a plan view of the semiconductor device in accordance with an eighth embodiment of the present invention.

First, as shown in FIG. 19, source/drain field limiting layer 5d having the function of resistance element R has a portion of which width changes steeply, as in the case of the semiconductor device shown in FIG. 14.

An electrode 7e is formed to cover the steeply changing portion. Electrode 7e is electrically connected to an aluminum interconnection 14 that is connected to source/drain region 4d.

Except for this point, the structure is the same as that of the semiconductor device shown in FIGS. 13 and 14. Therefore, corresponding portions are denoted by the same reference characters and description thereof will not be repeated.

By the above described semiconductor device, the following effect can be obtained in addition to the effects described with reference to the fifth embodiment.

Figure 20:
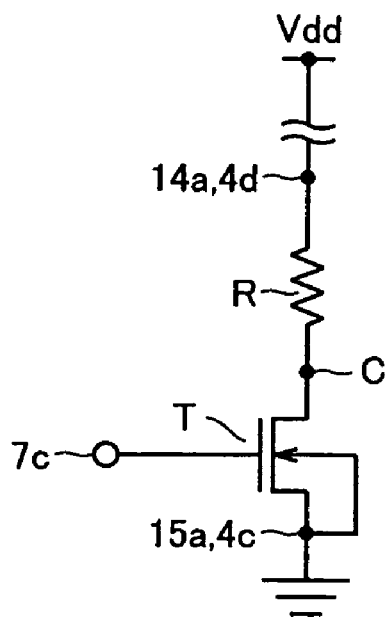
FIG. 20 represents an equivalent circuit of the semiconductor device in accordance with the same embodiment shown in FIG. 19.
Figure 21:
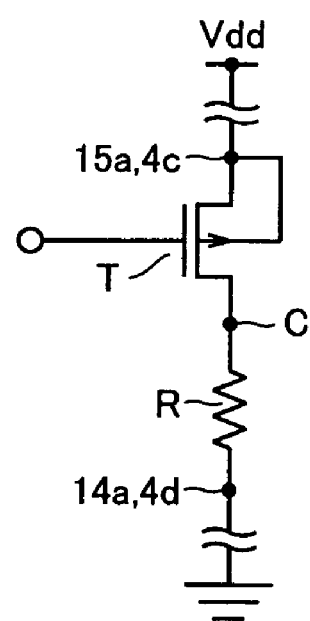
FIG. 21 represents another equivalent circuit of the semiconductor device in accordance with the same embodiment shown in FIG. 19.

FIG. 20 represents an equivalent circuit in which an n-channel MOS transistor T and a resistance element R are connected in series, and FIG. 21 represents an equivalent circuit in which a p-channel MOS transistor T and a resistance element R are connected in series.

In the example shown in FIG. 13, a high reverse bias voltage is applied to source/drain region 4d through contact portion 14a, and when the n-channel MOS transistor or the p-channel MOS transistor is off, a high reverse bias voltage will be applied to the entire resistance element R.

In the present semiconductor device, electrode 7e is formed to cover resistance element R (source/drain field limiting layer 5d). Electrode 7e is electrically connected to aluminum interconnection 14, and hence, electrode 7e comes to have the same voltage as the voltage of source/drain region 4d.

By the voltage applied to electrode 7e, an electric field is generated toward well 2. By this electric field, the depletion layer that extends from the interface between source/drain field limiting layer 5d serving as the resistance element R and well 2 is further extended.

Accordingly, even when there is formed a steep portion in source/drain region 5d serving as the resistance element R, breakdown voltage in the resistance element R and the MOS transistor can be ensured.

When a high reverse bias voltage is applied to source/drain region 4d and the n-channel MOS transistor or the p-channel MOS transistor is on, the reverse bias voltage is limited by the voltage drop caused by the resistance element R, at the portion of resistance element R on the side of channel region 11c.

Therefore, it follows that the breakdown voltage of resistance element R and well 2 depends mainly on the reverse bias voltage applied to a portion of resistance element R on the side of source/drain region 14a. At this time, the depletion layer is extended by the electric field generated by the voltage applied to electrode 7e, and therefore, breakdown voltage can be improved even when the MOS transistor is on. The above described function and effect are the same in the example shown in FIG. 21.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
a first impurity region of a first conductivity type formed on a main surface of a semiconductor substrate;
a first isolating insulation film formed on a surface of said first impurity region, the first isolating insulation film includes a portion formed to a predetermined depth from the main surface of the semiconductor substrate;
a second impurity region of a second conductivity type formed at that portion of said first impurity region which is positioned immediately below said first isolating insulation film;
a third impurity region of the second conductivity type formed at a surface of a portion of said first impurity region, spaced apart from said first isolating insulation film;
a fourth impurity region of the second conductivity type formed on a portion of said first impurity region on a side opposite to said third impurity region with said first isolating insulation film positioned therebetween, said fourth impurity region of the second conductivity type spaced apart from said first isolating insulation film;
a first gate electrode portion formed on that portion of said first impurity region which is sandwiched between said second impurity region and said third impurity region; and
a second gate electrode portion formed on that portion of said first impurity region which is sandwiched between said second impurity region and said fourth impurity region,
wherein the first gate electrode portion and the second gate electrode portion are configured for receiving voltages individually applied thereto, and the first gate electrode portion and second gate electrode portion are not electrically connected, and
said first isolating insulation film is formed continuously between said first gate electrode portion and said second gate electrode portion.

2. The semiconductor device according to claim 1, wherein said second impurity region, said third impurity region and said fourth impurity region are each formed as wells.

* * * * *